United States Patent [19]
Cochran

[11] Patent Number: 5,881,110
[45] Date of Patent: Mar. 9, 1999

[54] CARRIER PHASE SYNCHRONIZATION BY REVERSE PLAYBACK

[75] Inventor: Bruce A. Cochran, Mesa, Ariz.

[73] Assignee: Sicom, Inc., Scottsdale, Ariz.

[21] Appl. No.: 758,380

[22] Filed: Nov. 29, 1996

[51] Int. Cl.$^6$ ................................................. H04L 27/14
[52] U.S. Cl. .......................... 375/324; 375/376; 329/307
[58] Field of Search .................................. 375/324, 326, 375/355, 327, 372, 376, 344; 329/308, 307

[56] References Cited

U.S. PATENT DOCUMENTS

| | | | |
|---|---|---|---|
| 4,466,108 | 8/1984 | Rhodes ..................................... | 375/344 |
| 4,856,027 | 8/1989 | Nakamura et al. ...................... | 375/327 |
| 4,968,955 | 11/1990 | Yoshida et al. .......................... | 375/324 |
| 5,440,265 | 8/1995 | Cochran et al. ......................... | 329/300 |
| 5,533,059 | 7/1996 | Tsuda ....................................... | 375/327 |

*Primary Examiner*—Temesghen Ghebretinsae
*Attorney, Agent, or Firm*—Meschkow & Gresham, P.L.C.

[57] ABSTRACT

A digital demodulator (10) reads symbol samples into a memory buffer (38) that can be played forward and backward into a phase locked loop (48). During an initial non-data directed symbol timing estimating phase (56) the demodulator (10) achieves an approximate frequency synchronization and starts to achieve phase synchronization on an incoming stream of symbols. During a first forward readout pass (58) of stored samples, the phase locked loop (48) begins the frequency and phase convergence. During subsequent pass (60) using a reverse readout of stored samples, phase locked loop (48) continues to converge toward zero phase error. Then another forward pass (66), phase locked loop (48) achieves usable frequency and phase synchronization of carrier and begins valid data extraction.

19 Claims, 4 Drawing Sheets

CARRIER PHASE SYNCHRONIZATION BY REVERSE PLAYBACK

LICENSE RIGHTS

This invention was made with government support under contract DAAB07-96-D614 awarded by US Army Communications-Electronics Command. The government has certain rights in the invention.

TECHNICAL FIELD OF THE INVENTION

This invention relates generally to synchronization and demodulation techniques in digital communication systems where phase locked loops are employed. More particularly, this invention relates to demodulation schemes that require synchronizing the frequency and/or phase of a local oscillator to a received carrier.

BACKGROUND OF THE INVENTION

Demodulation schemes that employ phase locked loops typically do not have an internal signal source that is initially synchronized precisely with a received burst carrier signal. Thus, receivers use the phase locked loops to converge on an incoming frequency and/or phase during the "acquisition" of a received carrier signal. An acquisition phase occurs before valid data can be extracted and includes both carrier acquisition and symbol synchronization.

The steps of carrier acquisition and symbol synchronization are often unproductive overhead time in communication systems. In communication systems conveying lengthy transmissions of large amounts of data, this overhead acquisition phase is relatively unimportant. However, in certain other systems, such as TDMA burst systems, slow overhead acquisition times translate into unacceptably low operating efficiencies.

Various demodulation methods have been used to rapidly extract data from a carrier signal. As an example, the technique known as "differential" demodulation is a robust method of data extraction, but the penalty for using it is a 3–6 dB performance loss that leads to higher transmission power requirements, greater flux density, unsuitable bit error rates, and/or greater likelihood of interference with adjacent channels.

A phase coherent demodulator solves the 3–6 dB penalty of differential demodulation. With coherent demodulation, a phase locked loop accurately achieves carrier synchronization. The problem with the phase locked loop's ability to acquire frequency and phase synchronization is that acquisition times are highly dependent upon the frequency and phase error, or the amount of deviation between the incoming signal and an internal phase locked loop oscillator. Phase locked loops can require an undesirably long time to converge on a signal during acquisition unless the loop filter bandwidth is made very wide. The wider the bandwidth, the more the phase locked loop exhibits phase jitter.

An attempt to overcome this problem by estimating phase based upon a captured block of samples rather than relying solely a phase locked loop has been developed. This technique is called Block Phase Estimation. Block Phase Estimation has one major limitation. It does not work well if the frequency error is more than approximately one percent of the symbol rate. Unfortunately, frequency errors of greater than one percent are not uncommon.

One could simply capture an entire burst and reprocess the burst over and over as taught in U.S. Pat. No 5,440,265 assigned to the assignee of the present invention. But excessive reprocessing of symbols leads to transport delay and should be kept to a minimum. Moreover, reprocessing a block of symbols in a consistently forward order after a phase locked loop has begun its convergence process and has partially acquired a frequency and a phase causes the phase locked loop to experience a discontinuity or transient that extends the carrier acquisition time. In particular, the phase of the incoming signal at the end of the block typically bears no relationship to the phase of the incoming signal at the beginning of the block. Thus, phase convergence efforts of the phase locked loop in a prior block-processing pass are largely lost when a subsequent block-processing pass begins.

SUMMARY OF THE INVENTION

Accordingly, it is an advantage of the present invention that improved synchronization and demodulation techniques for use in digital communication systems where phase locked loops are employed are provided.

Another advantage is that the present invention provides rapid carrier acquisition and symbol synchronization with minimal transport delays and overhead processing time.

Another advantage is that the present invention allows a phase locked loop to achieve carrier acquisition in response to a signal presented in a reverse order.

The above and other advantages of the present invention are carried out in one form by a method for rapid carrier phase synchronization to an incoming signal conveying data in a stream of symbols. This method includes the steps of estimating symbol timing on an incoming block of symbols, sampling the incoming signal in response to the estimated symbol timing to produce samples in a forward order, buffering the incoming block of samples into a memory, reading the samples from memory in a reverse order, and carrier phase synchronizing an oscillator signal to the samples read in reverse order from memory.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

FIGS. 1 through 4 illustrate preferred embodiments of an apparatus and method of rapid carrier phase synchronization in a digital communications receiver demodulator. Rapid carrier phase synchronization is achieved through a technique of reverse playback of stored samples into a phase locked loop.

Figure 1:
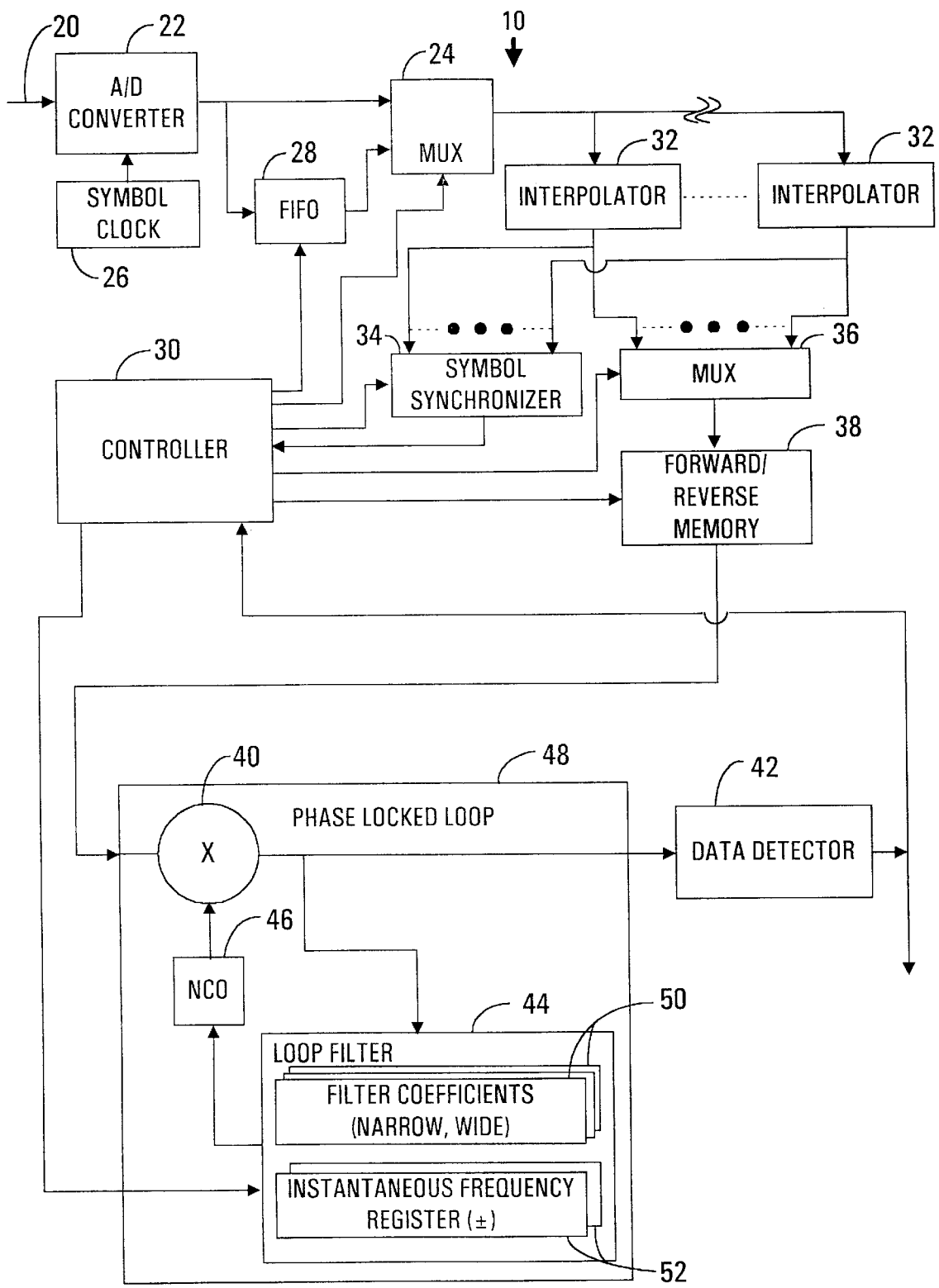
FIG. 1 shows a block diagram of a digital communications demodulator configured in accordance with the present invention.

FIG. 1 shows a block diagram of an exemplary digital communications receiver demodulator 10 which may be implemented with discrete components, with an integrated circuit, or with the aid of a Digital Signal Processor (DSP). FIG. 1 depicts digital component blocks used for synchronization and demodulation of radio frequency signals in a digital communications receiver. In general, the function of demodulator 10 is to extract digital data from a baseband communication signal and deliver the data to a device (not shown) which consumes or otherwise has a use for the data. Although the preferred embodiment works with quadrature signals, the quadrature signals are not shown for convenience.

An input terminal 20 of demodulator 10 couples to a first input of an A/D converter 22 having a first output coupled to a first data input of a multiplexer (mux) 24. A second input of A/D converter 22 couples to an output of a symbol clock circuit 26. A second output of A/D converter 22 couples to a data input of a first-in/first-out (FIFO) buffer memory 28. A control input of FIFO memory 28 couples to an output of a digital controller 30. A second data input of mux 24 couples to the output of FIFO memory 28. A selection input of mux 24 is coupled to an output of controller 30. An output of mux 24 couples to inputs of a bank of interpolators 32, each of which has an output coupled to an input of a symbol synchronizer circuit 34 and to a data input of a mux 36. A selection input of mux 36 couples to an output of controller 30. The output of mux 36 couples to a data input of a forward/reverse readout memory 38. An address input of forward/reverse readout memory 38 couples to an output of controller 30. A second input of symbol synchronizer circuit 34 couples to an output of controller 30. The output of the symbol synchronizer circuit 34 also couples to an input of controller 30. The data output of forward/reverse readout memory 38 couples to a first input of a phase comparator 40.

An output of phase comparator 40 couples to an input of a data detector 42. An output of data detector 42 couples to an input of controller 30 and provides the data output from demodulator 10. The output of the phase comparator 40 also couples to a signal input of a loop filter 44. An output of loop filter 44 couples to an input of a numeric controlled oscillator (NCO) 46. A control input of loop filter 44 couples to an output of controller 30. An output of numeric controlled oscillator 46 couples to a second input of phase comparator 40. Phase comparator 40, loop filter 44 and numeric controlled oscillator 46 taken together comprise a phase locked loop 48.

Loop filter 44 is desirably configured using conventional digital filtering techniques which cause phase locked loop 48 to operate as a second or higher order loop. Within loop filter 44 is a group of registers 50 containing filter coefficients that determine the loop filter bandwidth, as is conventional in digital filters. Changing the values of the filter coefficients causes the loop filter to exhibit a variable bandwidth. Coefficient values are supplied to filter coefficient registers by controller 30 in a manner which is discussed below. Also within loop filter 44 are state variable registers 52 that store instantaneous frequency and phase describing the state of filter 44. Phase, and more particularly frequency, values are supplied to instantaneous frequency and phase registers 52 by controller 30.

An incoming radio frequency signal entering demodulator 10 has been converted to baseband before it is presented to A/D converter 22 for sampling. The preliminary circuitry that performs this baseband conversion is well known to those skilled in the art and is not shown in FIG. 1. Prior to the extraction of useful data from the incoming signal, demodulator 10 performs symbol synchronization and carrier acquisition. During carrier acquisition the difference between the frequency of the incoming baseband signal 20 and the frequency of a local reference oscillator (i.e., NCO 46) is detected by phase comparator 40, and phase locked loop 48 adjusts this difference until it is reduced to zero. Differences in phase between the incoming signal and NCO 46 are processed in a similar manner by phase locked loop 48. Thus, phase locked loop 48 "converges" a local oscillator signal to match an incoming baseband signal.

However, before beginning carrier acquisition, the initial task performed by demodulator 10 is to achieve some degree of symbol synchronization without regard to the extraction of usable data. In other words, demodulator 10 performs a non-data directed symbol synchronization process that does not rely upon information obtained from extracting data from the incoming signal.

Figure 2:
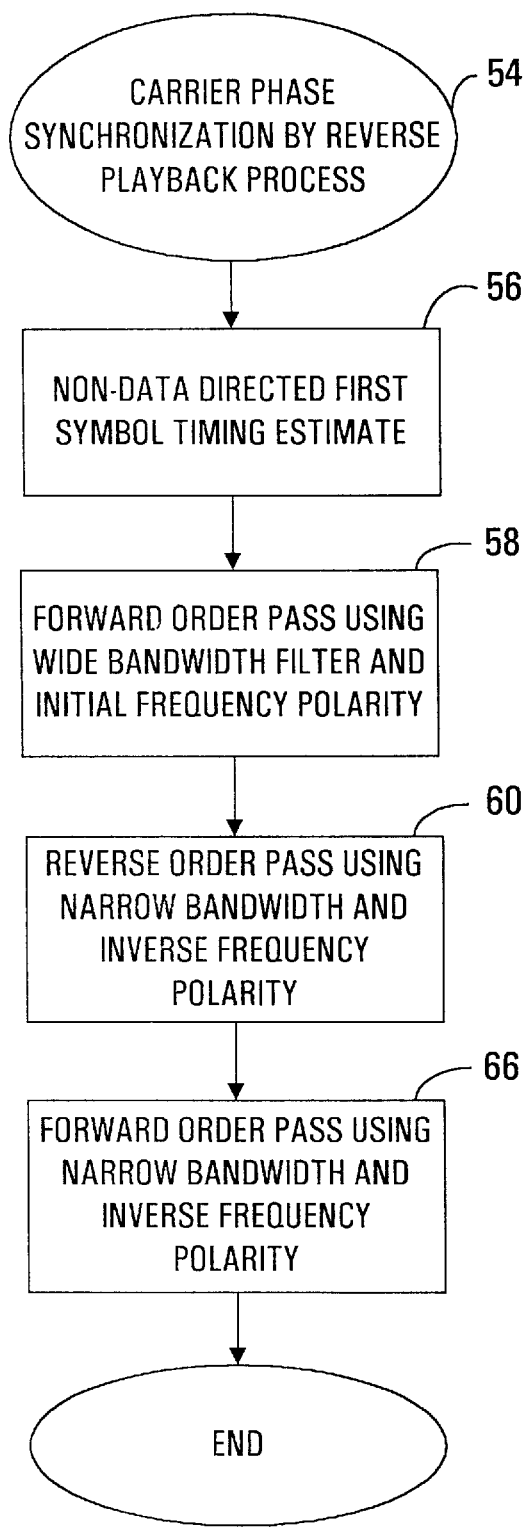
FIG. 2 shows a flowchart of a carrier phase synchronization by reverse playback process.

A carrier phase synchronization by reverse playback process 54 is shown in a flowchart as FIG. 2. A task 56 makes a non-data directed symbol timing estimate. Referring to FIGS. 1 and 2, during task 56, the baseband analog signal is converted into a stream of sampled digital representations by A/D converter 22 under the control of a symbol clock 26. In addition, during task 56 mux 24 switches data from A/D converter 22 directly to interpolators 32.

Initially, the output of A/D converter 22 is gated directly through mux 24 to interpolators 32 while simultaneously loading the same signal into FIFO 28. As will be appreciated by those skilled in the art, interpolators 32 reproduce a sampled input waveshape, but delay it in time by a fixed amount. In the preferred embodiment, the same waveshape is presented to each interpolator 32 at the same time in a parallel fashion, but the output from each interpolator 32 generates samples corresponding to the waveshape at a time that is unique for each interpolator 32. Of course, one of the interpolators 32 may impose a time delay of zero and be implemented by a direct signal path. Otherwise, the amounts of delay imposed by interpolators 32 are distributed throughout a symbol period.

Symbol synchronizer circuit 34 performs comparisons of the waveshapes obtained from interpolators 32 to ideal phase states for conveyed data to detect the one waveshape having the least error from ideal phase states. Controller 30 then selects this one interpolator 32 to drive forward/reverse memory 38 through mux 36. Controller 30 also then causes FIFO 28 to read out its contents through mux 24. From this point on in process 54, all signals from A/D 22 are routed through FIFO 28 and mux 24 to interpolators 32. In addition, the estimated samples generated by the selected interpolator 32 are routed through mux 36 to memory 38. In the preferred embodiment, memory 38 is a random-access memory capable of both writing and reading at the symbol rate. In other words, memory 38 can perform a write operation and a separate read operation during each symbol period.

At the end of task 56 in synchronization process 54, demodulator 10 has estimated symbol timing and process 54 begins a task 58. To assist with carrier convergence, phase locked loop 48 is introduced into process 54 in task 58 and subsequent tasks. Phase locked loop 48 converges on the frequency and phase of an incoming signal. Controller 30 can vary the operating bandwidth of phase locked loop 48 by changing the filter coefficients of register 50 in loop filter 44 (see FIG. 1). To minimize the time required for phase locked loop 52 to converge on the incoming signal, loop filter 44 is set to a wide bandwidth during task 58. In this embodiment a second order phase locked loop is used, mathematically governed by a loop filter equation of the type: $f(s)=a(1+b/s)$. The $b/s$ term of the loop filter equation is a frequency term having a polarity characterized by the value in instantaneous frequency register 52. The value in the instantaneous frequency register 52 corresponds to the difference between the current frequency that the numeric controlled oscillator 46 is generating and the incoming samples from memory 38.

During task 58 and subsequent tasks, controller 30 causes addresses presented to memory 38 to play back samples in a particular order. During task 58, samples written into memory 38 are immediately read from memory. This causes the samples to be played back in a forward order. Task 58 in FIG. 2 shows a forward order pass using wide bandwidth. Loop filter coefficients register 50 is loaded with wide bandwidth coefficients. The instantaneous frequency register 52 is set to an initializing value.

Figure 3:
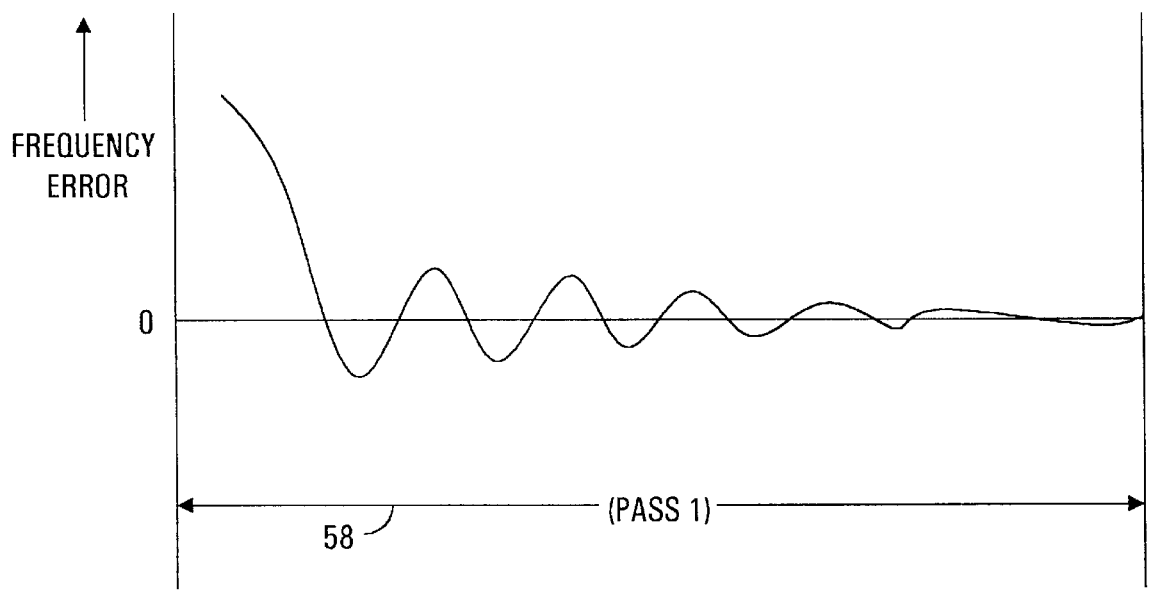
FIG. 3 shows a timing diagram of an exemplary phase locked loop frequency error during carrier synchronization.

FIG. 3 shows a timing chart of an exemplary output waveshape of phase locked loop 48 during the first pass of task 58. At the end of forward pass task 58, phase locked loop 48 has converged much closer toward the zero frequency error value than it was at the beginning of pass one.

Figure 4:
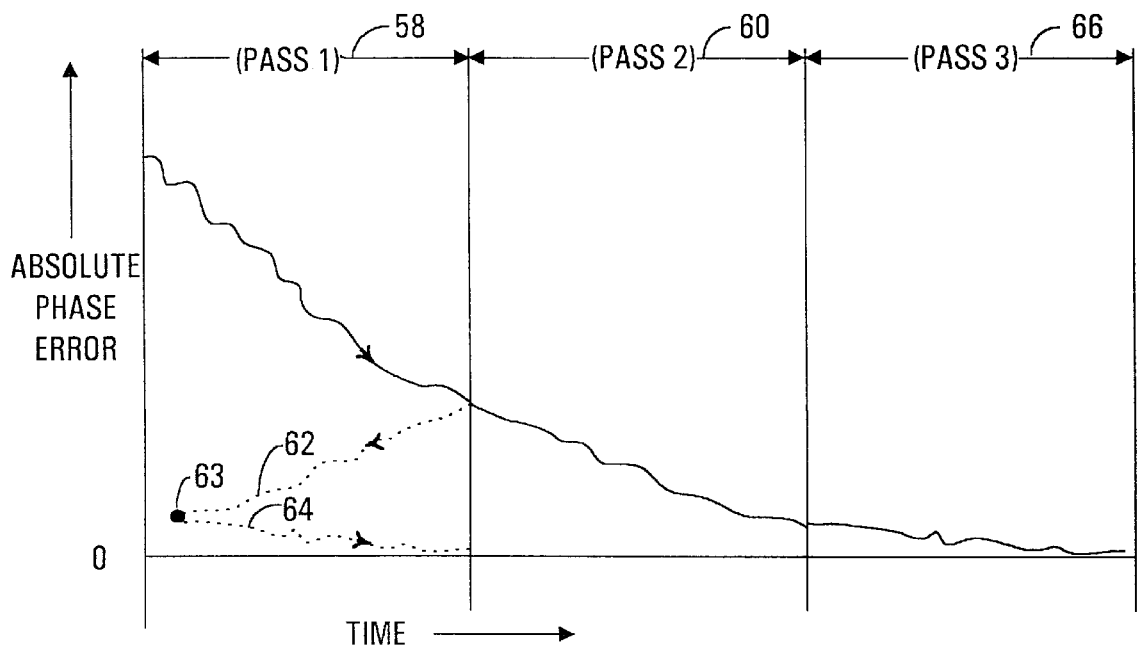
FIG. 4 shows a timing diagram of an exemplary phase locked loop phase error during carrier synchronization.

FIG. 4 shows an exemplary phase error waveshape of phase locked loop 48 during each of three memory playback passes. During the time period of task 58, phase locked loop 48 has also been converging toward the zero phase error value, as shown in FIG. 4. However, only a small amount of phase convergence has occurred, due in part to the wide bandwidth of loop filter 44 during task 58.

Controller 30 reverses the polarity of instantaneous frequency register 52 at the beginning of a task 60 in preparation for a backward readout from memory 38. The filter coefficients register is set to narrow bandwidth for finer phase convergence, which also reduces phase "jitter" in the phase locked loop.

If phase locked loop 48 were presented with another identical forward readout of the samples from memory 38 after the forward pass of task 58, benefits gained toward phase convergence during task 58 would be lost. Unlike frequency, the phase of the incoming signal at the end of task 58 typically bears no relation to the initial phase of the input signal. However, by reversing the direction of the samples presented to phase locked loop 48 at this juncture and reversing the polarity of the frequency state variable of loop filter 44 to accommodate the simulated backward motion in time, the phase convergence gained during task 58 is preserved.

Task 60 of process 54 is a reverse order pass using a narrow bandwidth in loop filter 44 and an inverted polarity for the frequency state variable value in register 52 (see FIG. 1). The same samples presented to phase locked loop 48 during task 58 are presented again in task 60, except in reverse order. Controller 30 causes forward/reverse memory 38 to readout in a reverse (back to front) order during task 60. With task 60, controller 30 sets loop filter coefficients register 50 so that phase locked loop 48 exhibits a narrow bandwidth. Phase locked loop 48 continues toward convergence at the point where it left off at the end of task 58. The dotted line 62 shown in FIG. 4 represents the sample block readout as if it were flowing backward in time. The solid line shown in the second pass of FIG. 4 shows the same waveform mirrored in the forward direction to indicate the phase convergence proceeding forward in time. During task 60 no incoming data is lost, since new incoming data is being written into forward/reverse memory 38 at the same time the prior data block samples are being read in reverse order.

Also during task 60, controller 30 searches for a special data pattern or preamble signifying the beginning of the incoming signal. When the beginning of the incoming signal has been detected, for example at a point 63, controller 30 can reverse direction of the readout from memory 38 immediately and continue to extract valid data. At this poing, phase locked loop 48 has nearly achieved a precise carrier synchronization.

After task 60, a task 66 is performed continuing to use a narrow bandwidth in loop filter 44 in the preferred embodiment of this invention. In alternate embodiments, filter coefficients 50 could be progressively adjusted for increasingly narrower bandwidth during the third pass of task 66. In addition, the polarity of frequency state variable 52 in the loop filter 44 is inverted from its state at the end of task 60. FIG. 4 shows the waveshape converging on the zero phase error line at the end of task 66. Beginning in task 66, demodulator 10 has achieved sufficiently precise carrier frequency and phase synchronization, that data detector 42 can extract valid data for the data consumer. Desirably, demodulator 10 can now continue to perform normal data extraction on incoming signals or perform other tasks required by controller 30. The length of the processed block of samples is desirably no longer than needed to minimize transport delay. This block length is determined by worst case frequency offset and signal-to-noise ratio and varies according to the application.

In summary, the present invention provides a rapid carrier synchronization apparatus and method. The present invention acquires symbol timing rapidly by storing incoming samples into a forward/reverse readout memory and using a phase locked loop during reverse readout to converge on the phase of stored samples while making use of phase convergence attained during a prior pass.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method for rapid carrier phase synchronization of an incoming signal conveying data in a stream of symbols, said method comprising the steps of:

a) estimating symbol timing on an incoming block of said symbols;

b) sampling said incoming signal to produce samples in a forward order;

c) buffering said samples into a memory;

d) reading said samples from said memory in a reverse order; and e) carrier phase synchronizing an oscillator signal to said samples read in said reverse order from said memory.

2. A method as claimed in claim 1 additionally comprising the step of:

f) synchronizing said oscillator signal to said samples presented in said forward order prior to said reading in reverse order step d).

3. A method as claimed in claim 2 additionally comprising the steps of:

employing a phase locked loop having a loop filter which has a register defining an instantaneous frequency, said frequency exhibiting a polarity; and reversing said polarity of said instantaneous frequency between said step f) and said step e).

4. A method as claimed in claim 2 additionally comprising the steps of:

employing a phase locked loop having a loop filter; and controlling said loop filter to exhibit a relatively wide bandwidth during said step f) and to exhibit a relatively narrow bandwidth during said step e).

5. A method as claimed in claim 1 additionally comprising the steps of:

detecting data while reading said samples from said memory in said reverse order; and monitoring said detected data to identify a beginning of said incoming signal.

6. A method as claimed in claim 1 additionally comprising the step of:

f) synchronizing said oscillator signal to said samples presented in said forward order after said reading in reverse order step d).

7. A method as claimed in claim 6 additionally comprising the steps of:

employing a phase locked loop having a loop filter which has a register defining an instantaneous frequency, said frequency exhibiting a polarity; and reversing said polarity of said instantaneous frequency between said step e) and said step f).

8. A method as claimed in claim 1 wherein said estimating step a) performs non-data directed symbol synchronization.

9. A rapid synchronization demodulator which operates on an incoming signal that conveys data in a stream of symbols, said demodulator comprising:

a) a symbol synchronizer for estimating symbol timing on an incoming block of said symbols;

b) a sampler, coupled to said symbol synchronizer, for sampling said incoming signal to produce samples in a forward order;

c) a memory having a data input coupled to said sampler and having an address input and a data output;

d) a controller coupled to said address input of said memory, said controller being configured to cause said samples to be read from said memory in a reverse order; and e) a phase locked loop having an input coupled to said memory data output.

10. A demodulator as claimed in claim 9 wherein:

said phase locked loop includes an oscillator which generates an oscillator signal;

said controller is configured to present to said phase locked loop said samples in said forward order prior to causing said samples to be read in said reverse order; and said phase locked loop synchronizes said oscillator signal to said samples presented in said forward order and to said samples read in said reverse order.

11. A demodulator as claimed in claim 10 wherein:

said phase locked loop includes a loop filter having a register defining an instantaneous frequency, said frequency exhibiting a polarity; and said controller causes said loop filter register to reverse said frequency polarity between said forward order presentation of said samples and said reverse order reading of said samples.

12. A demodulator as claimed in claim 11 wherein:

said phase locked loop includes a loop filter capable of exhibiting a variable bandwidth;

said controller enables said loop filter to exhibit a relatively wide bandwidth during said forward order presentation of said samples; and said controller enables said loop filter to exhibit a relatively narrow bandwidth during said reverse order reading of said samples.

13. A demodulator as claimed in claim 10 wherein:

said phase locked loop includes a loop filter capable of exhibiting a variable bandwidth;

said controller enables said loop filter to exhibit a relatively wide bandwidth during said forward order presentation of said samples; and said controller enables said loop filter to exhibit a relatively narrow bandwidth during said reverse order reading of said samples.

14. A demodulator as claimed in claim 10 wherein:

said phase locked loop includes an oscillator which generates an oscillator signal;

said controller is configured to present to said phase locked loop said samples in a forward order after causing said samples to be read in said reverse order; and said phase locked loop synchronizes said oscillator signal to said samples presented in said forward order subsequent to said reverse order.

15. A demodulator as claimed in claim 14 wherein:

said phase locked loop includes a loop filter capable of exhibiting a variable bandwidth;

said controller enables said loop filter to exhibit a first bandwidth during said forward order presentation of said samples prior to said reverse order reading of said samples;

said controller enables said loop filter to exhibit a second bandwidth during said reverse order reading of said samples; and said controller enables said loop filter to exhibit a third bandwidth during said forward order presentation of said samples occurring after said reverse order reading of said samples, said second and third bandwidths being narrower than said first bandwidth.

16. A demodulator as claimed in claim 15 wherein:

said loop filter of said phase locked loop has a register defining an instantaneous frequency, said frequency exhibiting a polarity; and said controller causes said loop filter register to reverse said frequency polarity between said forward order presentation of said samples and said reverse order reading of said samples, and between said reverse order reading of said samples and subsequent forward order presentation of said samples.

17. A demodulator as claimed in claim 9 wherein:

said phase locked loop includes an oscillator which generates an oscillator signal;

said controller is configured to present to said phase locked loop said samples in a forward order subsequent to said samples having been read in said reverse order; and said phase locked loop synchronizes said oscillator signal to said samples read in reverse order and to said samples presented in said forward order.

18. A demodulator as claimed in claim 17 wherein:

said phase locked loop includes a loop filter having a register defining an instantaneous frequency, said frequency exhibiting a polarity; and said controller causes said loop filter register to reverse said frequency polarity after said reverse order reading of said samples and before said forward order presentation of said samples.

19. A method for rapid carrier phase synchronization to an incoming signal conveying data in a stream of symbols, said method comprising the steps of:

estimating symbol timing on an incoming block of said symbols in a non data-directed manner;

sampling said incoming signal to produce samples in a forward order;

storing said samples into a memory capable of readout in said forward order and in a reverse order;

employing a phase locked loop having a loop filter which has a register defining an instantaneous frequency, said frequency exhibiting a polarity;

controlling said memory to present said samples in a first pass, a second pass, and a third pass, said first pass presenting said samples in said forward order to said phase locked loop, said second pass presenting said samples in said reverse order to said phase locked loop, and said third pass presenting said samples in said forward order to said phase locked loop;

controlling said loop filter to exhibit a relatively wide bandwidth during said first pass;

reversing said polarity of said instantaneous frequency register between said first pass and said second pass;

controlling said loop filter to exhibit a relatively narrow bandwidth during said second pass;

detecting a data pattern that identifies a beginning of said incoming signal during said second pass; and reversing said polarity of said instantaneous frequency between said second pass and said third pass.

* * * * *